United States Patent

Shimmell

Patent Number: 5,901,072
Date of Patent: May 4, 1999

[54] METHOD FOR INCORPORATING BOUNDARY CONDITIONS INTO FINITE ELEMENT ANALYSIS

[75] Inventor: Dennis S. Shimmell, Hudsonville, Mich.

[73] Assignee: Nelson Metal Products Corporation, Grandville, Mich.

[21] Appl. No.: 08/735,529

[22] Filed: Oct. 23, 1996

[51] Int. Cl.[6] ............................................. G06F 15/00
[52] U.S. Cl. ................................... 364/578; 395/500
[58] Field of Search ............................ 395/500; 364/508, 364/512, 578, 99; 384/117; 73/602

[56] References Cited

U.S. PATENT DOCUMENTS

| | | | |
|---|---|---|---|
| 4,256,354 | 3/1981 | Peterson | 398/139 |
| 4,575,358 | 3/1986 | Ferris | 464/90 |
| 5,253,528 | 10/1993 | Varterasian et al. | 73/582 |
| 5,421,655 | 6/1995 | Ide et al. | 384/99 |
| 5,425,584 | 6/1995 | Ide | 384/99 |
| 5,472,386 | 12/1995 | Kish | 475/338 |
| 5,479,824 | 1/1996 | Torres | 73/602 |
| 5,592,085 | 1/1997 | Ehaman | 324/309 |
| 5,603,574 | 2/1997 | Ide et al. | 384/117 |
| 5,657,588 | 8/1997 | Axon | 52/167.1 |
| 5,660,481 | 8/1997 | Ide | 384/122 |
| 5,668,429 | 9/1997 | Boud, Jr. et al. | 310/254 |
| 5,716,300 | 2/1998 | Sammataro et al. | 475/346 |

*Primary Examiner*—Allen R. MacDonald
*Assistant Examiner*—Hani Kazimi
*Attorney, Agent, or Firm*—Warner Norcross & Judd

[57] ABSTRACT

A method for conducting finite element analysis of a component which takes into consideration the apparent rigidity of an interface structure. The method generally includes the steps of (a) providing a standard shim bar, (b) physically measuring the natural frequencies of the standard shim bar when mounted to the interface structure, (c) generating a finite element model having a shim interposed between the component and ground, (d) selecting the modulus of elasticity of the shim as a function of the measured natural frequencies of the standard test bar mounted to the interface structure, and (e) once the appropriate modulus of elasticity is selected, performing the desired finite element analysis on the finite element model.

19 Claims, 7 Drawing Sheets

METHOD FOR INCORPORATING BOUNDARY CONDITIONS INTO FINITE ELEMENT ANALYSIS

BACKGROUND OF THE INVENTION

The present invention relates to numerical techniques for modeling and solving complex system equations through the use of a finite element model and more particularly to a method for incorporating boundary conditions into a finite element model.

Finite element analysis is a computerized method widely used in industry to model and solve engineering problems relating to complex systems. A finite element model is generating by reducing the system, or domain, into a number of discretized units typically referred to as finite elements. Once reduced, the domain can be represented by a system of equations that are solved, typically by computer, to predict the response of the domain to various external influences. Finite element analysis is used in a variety of applications including solid mechanics, fluid mechanics, biomechanics, heat transfer, geomechanics, aeromechanics, coupled systems, chemical reactions, acoustics, and electric and magnetic fields.

Perhaps the most common use of finite element analysis is in the field of solid mechanics where it is used to analyze structural problems. Finite element analysis software adapted for use with solid mechanics is available from a wide variety of commercial suppliers. Finite element analysis begins by using finite element software to generating a finite element model of the system. In this model, the component is reduced into a number of finite elements. The finite element reduction is fixed to "ground" at more or more locations to simulate attachment of the component to an interface structure. In the finite element model, "ground" represents a perfectly rigid structure that will not flex or move under a load. A simulated load or other influence is applied to the system and the resulting effect is analyzed using conventional mathematical methodologies. This method is well suited when the designed component is to interface with a structure that is, like ground, perfectly rigid. In many applications, however, the structure with which the component is to interface will not have such characteristics. This poses a significant problem because the rigidity of the interface structure affects the natural frequencies of any components attached thereto. For example, automobile engine mounting bosses do not have the same rigidity characteristics as ground. Therefore, engine brackets and similar components will exhibit different natural frequencies when mounted to the engine than when modeled using conventional finite element analysis.

One method for addressing this problem is to design the component using conventional finite element analysis, manufacture a prototype based on this design, and then physically determine the natural frequencies of the prototype attached to the interface structure (i.e. the engine). Once the actual natural frequencies are determined, the boundary conditions of the finite element model are adjusted using a trial and error method until an acceptable correlation with the measured frequencies is achieved. This process is extremely time consuming and CPU intensive because it requires the design and testing of an initial prototype as well as repeated adjustment and resolution of the system equations.

SUMMARY OF THE INVENTION

The aforementioned problems are overcome by the present invention wherein a method is provided for conducting finite element analysis of a component which takes into account the apparent rigidity of any interface structures. The method includes the steps of (a) determining the natural frequencies of a standard test bar attached to the interface structure; (b) generating, in a computer, a finite element shim as a function of the measured natural frequencies; (c) generating, in a computer, a finite element model having the shim interposed between the component and ground; and (d) performing, in a computer, the desired finite element analysis on the finite element model.

In the most preferred embodiment, the natural frequencies of the standard test bar are determined by mounting the bar to the interface structure and applying conventional physical testing methods. A finite element model is then generated in a computer consisting of a finite element shim interposed between a finite element reduction of the standard test bar and ground. The modulus of elasticity of the finite element shim is adjusted until the computed natural frequencies of the finite element test bar correlate with the measured natural frequencies of the test bar attached to the interface structure. Once the appropriate modulus of elasticity is determined, the shim is imported into a finite element model of the component where it is interposed between the component and ground. The finite element model can then be solved by computer using conventional techniques.

The present invention provides a simple and effective method for communicating the effect of an interface structure on the natural frequencies of a component and also for incorporating those effects into a finite element model of the system. The present invention eliminates the need for duplicate and wasteful trial and error engineering, dramatically reducing labor and CPU processing time.

These and other objects, advantages, and features of the invention will be readily understood and appreciated by reference to the detailed description of the preferred embodiment and the drawings.

DETAILED DESCRIPTION OF THE PREFERRED EMBODIMENT

Figure 11:
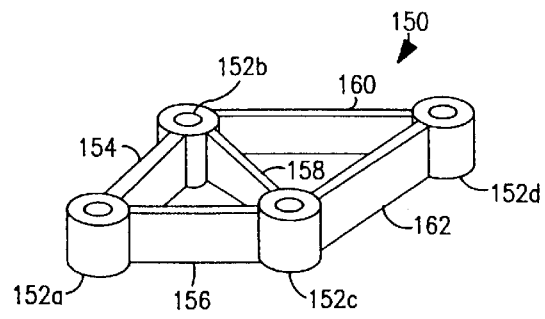
FIG. 11 is a perspective view of the engine bracket.
Figure 12:
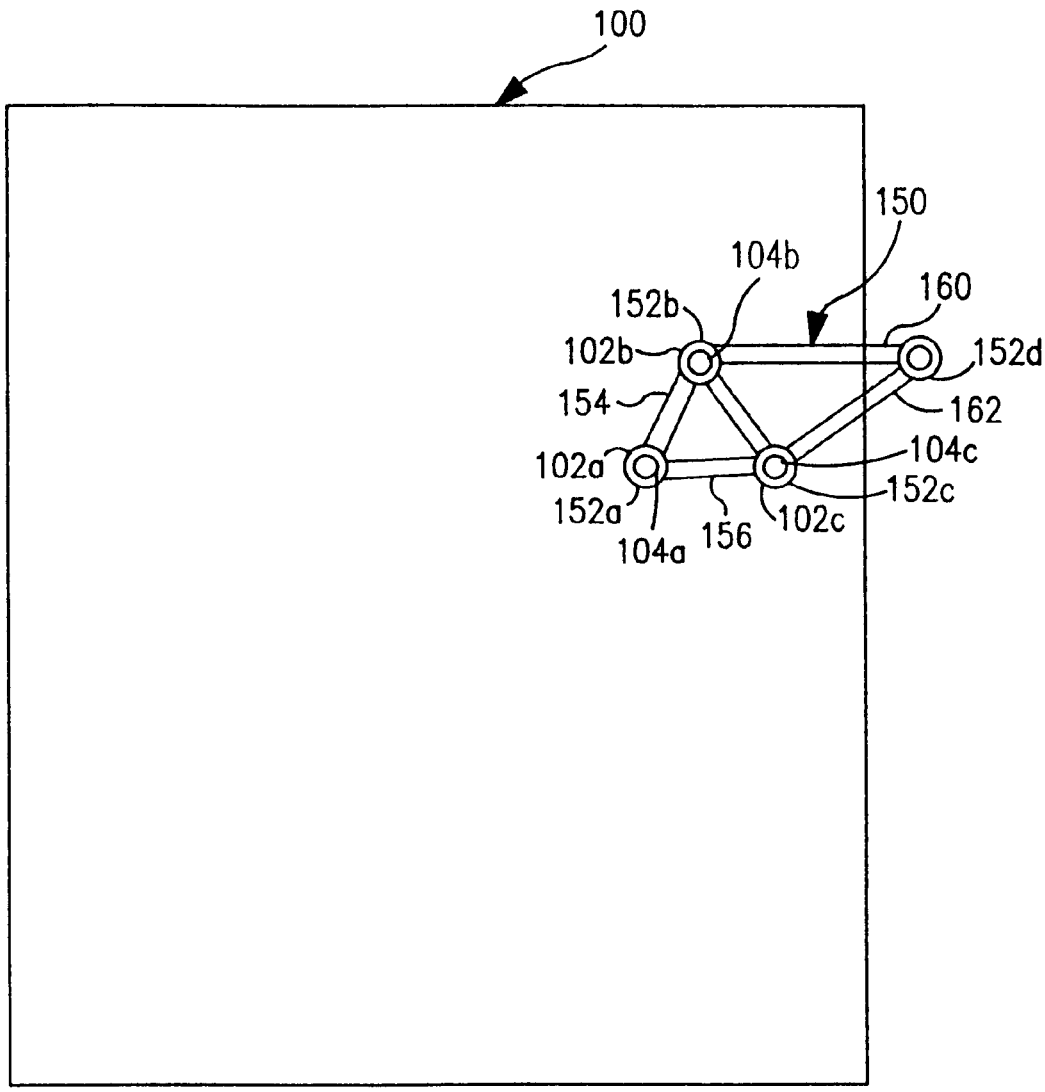
FIG. 12 is a side elevational view of the engine bracket mounted to a block representation of the engine.

In a preferred embodiment, the present invention provides a method for designing a component using finite element analysis (FEA) in which the finite element model incorporates certain boundary conditions which affect the natural frequencies of the component. The finite element model is generated and analyzed using conventional finite element analysis (FEA) software on a conventional computer system. For purposes of disclosure, and not by way of limitation, the present invention is described in connection with the design of an engine bracket 150 adapted to mount to engine 100. As shown in FIGS. 11 and 12, the engine bracket 150 includes a plurality of mounting bosses 152a–d interconnected by ribs 154, 156, 158, 160, and 162. Bosses 152a–c are adapted to mount to the engine (represented in FIG. 12 by block 100) at mounting locations 102a–c using conventional bolts 104a–c. Boss 152d is adapted to support an article such as an alternator (not shown).

Figure 1:
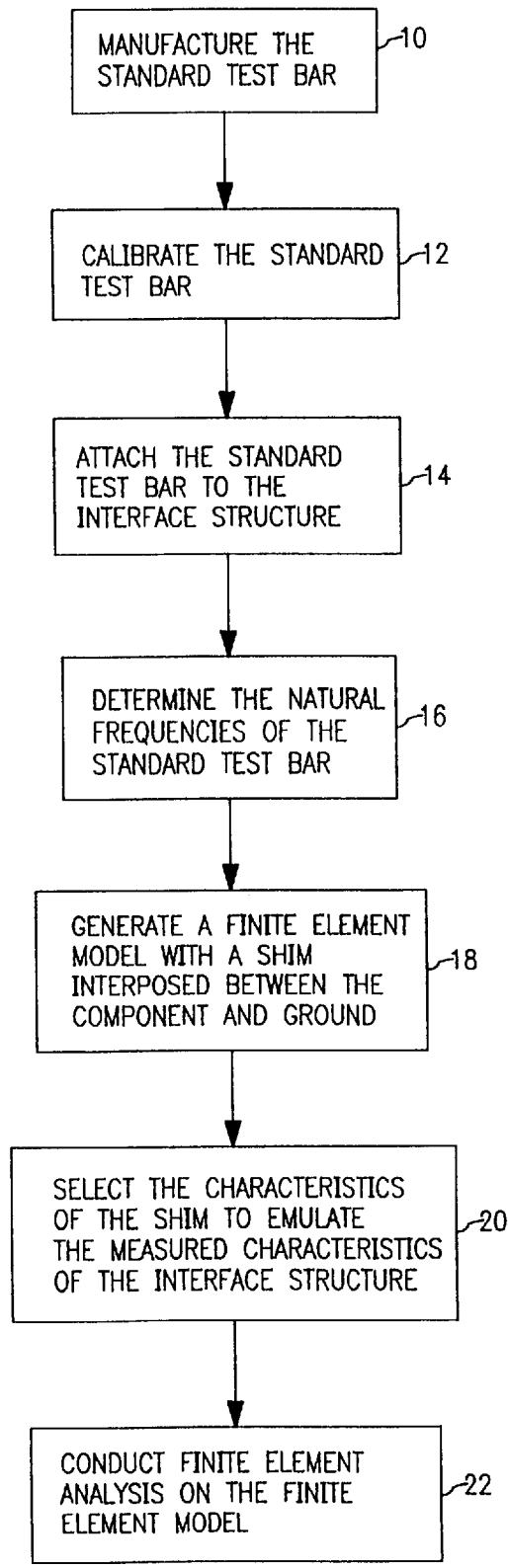
FIG. 1 is schematic diagram of the primary steps of the present invention.

FIG. 1 shows the primary steps involved in the present method. In general, the method includes manufacturing 10 a standard test bar 130 that is used to determine the apparent rigidity of the interface structure at each mounting location—in this case, engine 100 at mounting locations 102a–c. The standard test bar 130 is then calibrated 12 by generating a finite element model 130' of the test bar using conventional FEA software, and, as described in more detail below, selecting the characteristics of the finite element model 130' to correlate with the standard test bar 130. The calibrated standard test bar is then attached 14 to the interface structure at a mounting location and its natural frequencies are determined 16 using conventional physical methods. A finite element model 150' of the component 150 is then generated 18 using conventional FEA software with a shim 140' interposed 20 between the component 150' and ground (not shown). As described in more detail below, the characteristics of the shim 140' are selected 20 as a function of the measured natural frequencies. The finite element model 150' can then be solved 22 using conventional finite element methodologies.

Figure 3:
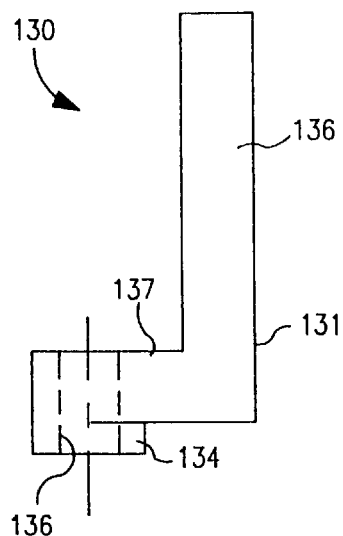
FIG. 3 is a side elevational view of the standard test bar.
Figure 2:
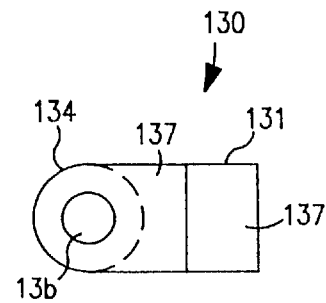
FIG. 2 is top plan view of the standard test bar.

Referring now to FIGS. 2 and 3, the standard test bar 130 includes an L-shaped leg 131 having a vertical portion 136, a horizontal portion 137, and a downwardly extending cylindrical neck 134. The vertical portion 136 extends parallel to the axis of the neck 134. The test bar 130 defines a bore 136 through the horizontal portion 137 and the neck 134 in axial alignment with the neck 134. The bore 136 functions as a boss for attaching the test bar 130 to an interface structure, such as engine 100, using conventional fasteners 102 (See FIG. 7). As the natural frequencies increases, they can become more difficult to discern using conventional physical techniques. Accordingly, the geometry of the test bar 130 is selected such that the first natural frequency is easily discernible when the test bar 130 is mounted to the interface structure and the bed plate. For example, the geometry may be selected so that the first natural frequency of the test bar 130 is approximately 800 HZ when mounted to a bed plate. The design of the standard test bar 130 may vary from application to application depending on the construction of the interface structure and the size and type of mounting apparatus used to secure the component to the interface structure.

Figure 5:
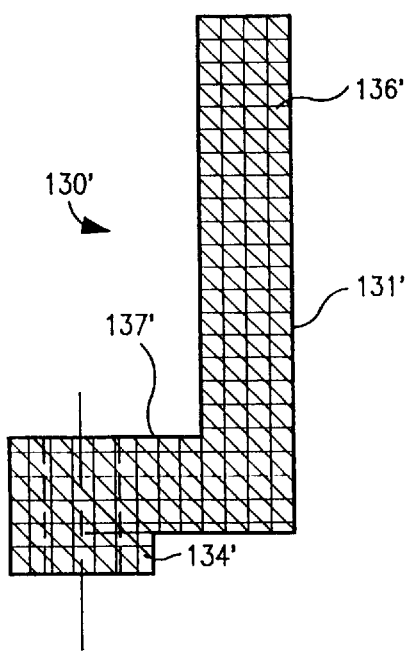
FIG. 5 is a side elevational view of the finite element model of the standard test bar.
Figure 4:
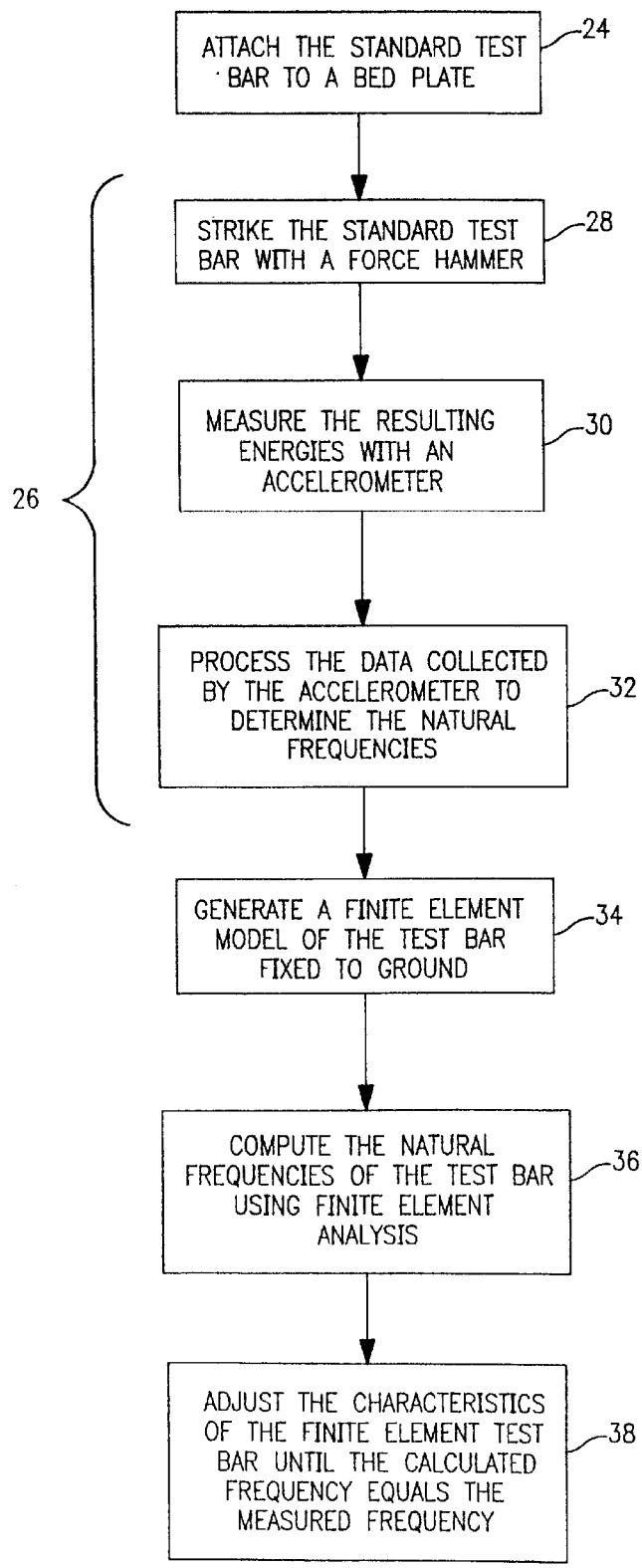
FIG. 4 is a schematic diagram of the primary steps of the standard test bar calibration process.

The standard test bar 130 is calibrated with a finite element representation of the test bar 130' so that FEA can be used to determine the appropriate characteristics of the shim 140'. The calibration process for the standard test bar 130 is described with reference to FIG. 4. First, the standard test bar 130 is attached 24 to a conventional bed plate (not shown). The natural frequencies of the test bar 130 are then determined 26 using conventional physical techniques. In the most preferred embodiment, the standard test bar 130 is struck 28 by a conventional force hammer (not shown) and the resulting energies are measured 30 by an accelerometer (not shown). The data collected by the accelerometer is then processed 32 using fast Fourier transform (FFT) methodologies to determine the natural frequencies. Second, a finite element model 130' of the standard test bar is generated 34 using conventional PEA software. The neck 134' of the finite element test bar 130' fixed directly to ground (See FIG. 5). The natural frequencies of the finite element test bar 130' are computed 36 using conventional PEA techniques. The characteristics of the finite element bar 130', such as the modulus of elasticity and the density, are adjusted 38 as necessary to bring the PEA computed frequencies into correlation with the measured frequencies. When these frequencies match with reasonable accuracy, the standard test bar 130 is calibrated with the finite element test bar 130'.

Figure 7:
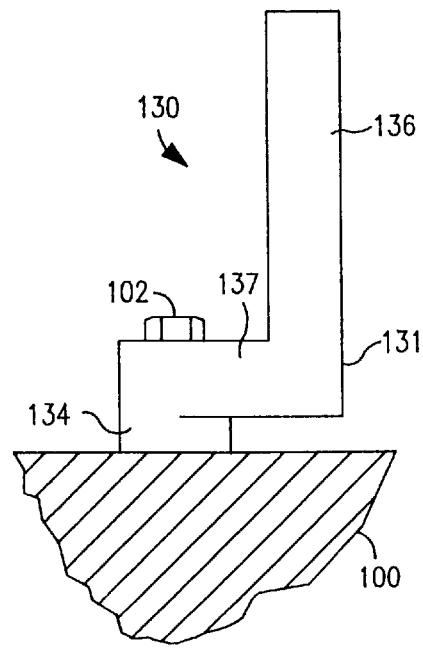
FIG. 7 is a partially sectional side elevational view of the standard test bar mounted to an engine.
Figure 6:
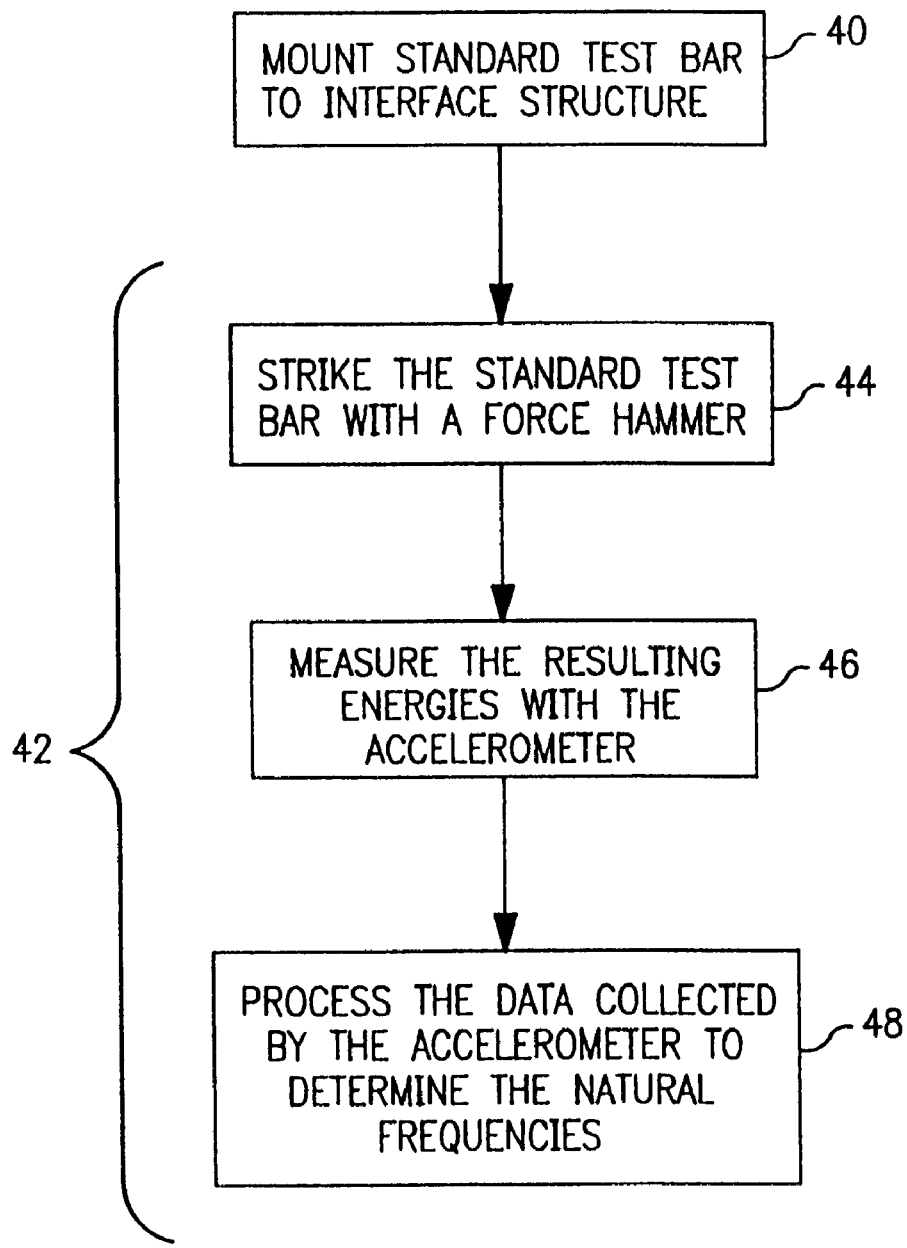
FIG. 6 is a schematic diagram of the primary steps of the interface structure measuring process.

The standard test bar 130 is use d to measure the rigidity characteristics of an interface structure, such as engine 100, so that those characteristics can be incorporated into the finite element model. The measuring process is described with reference to FIG. 6. As illustrated in FIG. 7, the standard test bar 30 is mounted 40 to the engine 100 at one of the mounting locations using a conventional fastener, such as bolt 102. The natural frequencies of the standard test bar 30 are then determined 42 using conventional physical testing methodologies. In the most preferred embodiment, the standard test bar 130 is struck 44 by a conventional force hammer (not shown) and the resulting energies are measured 46 by an accelerometer (not shown). The data collected by the accelerometer is then processed 48 using FFT methodologies to determine the test bar's 130 natural frequencies. The measuring process is repeated for each mounting location 102a–c.

If the frequencies of the test bar 130 attached to the engine 100 are approximately equal to the frequencies of the test bar 130 attached to the bed plate (not shown), then the apparent rigidity of the engine 100 at that mounting location is approximately equal to ground and the finite element model can be generated with the component fixed directly to ground at that location. If, however, as will typically be the case, the frequencies are not approximately equal, the finite element model of the component is generated with a shim interposed between the component and ground at that mounting location. The modulus of elasticity of the shim, or shim modulus, is selected so that the apparent rigidity of the shim matches that of the engine 100 at any given mounting location.

Figure 8:
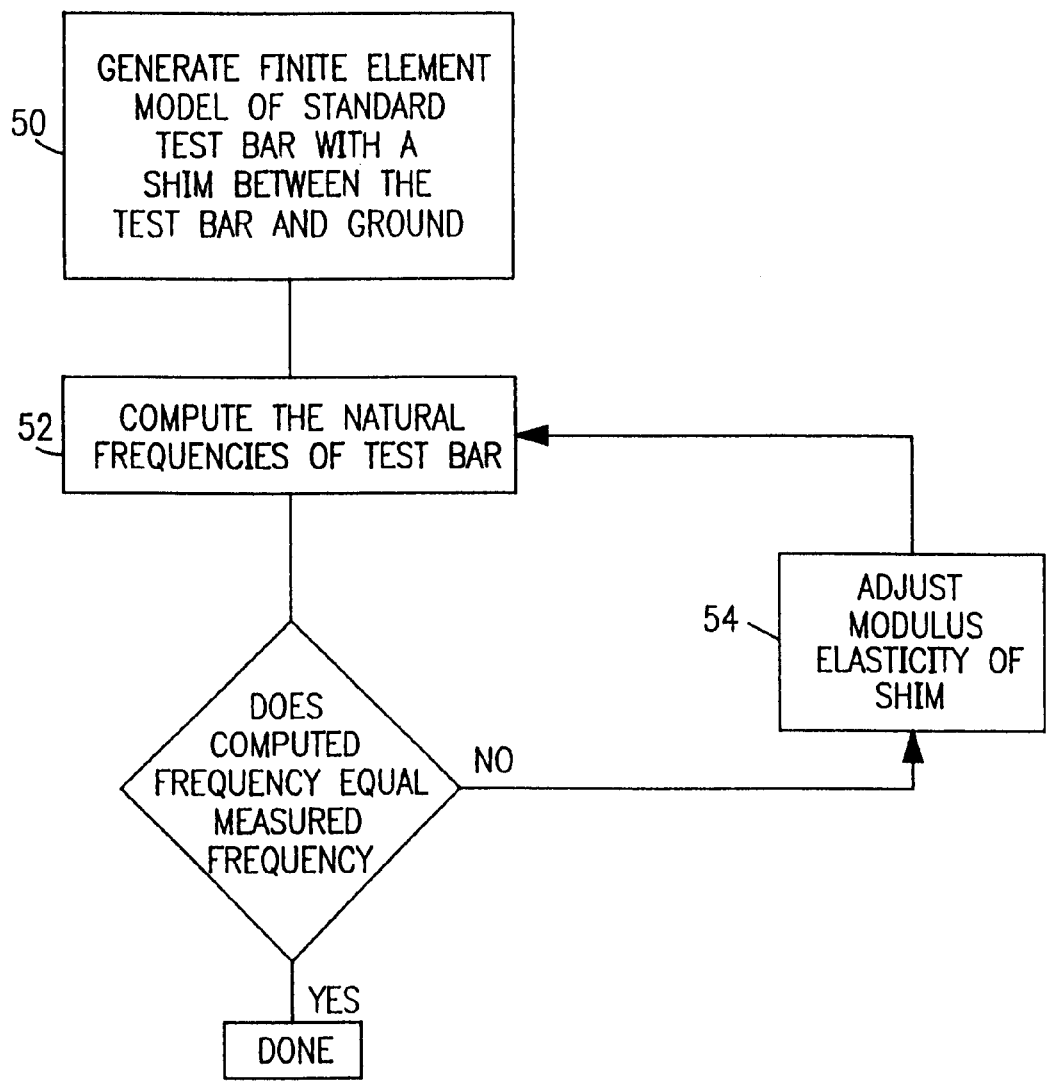
FIG. 8 is a schematic diagram of the primary steps of the shim modulus calculation process.
Figure 9:
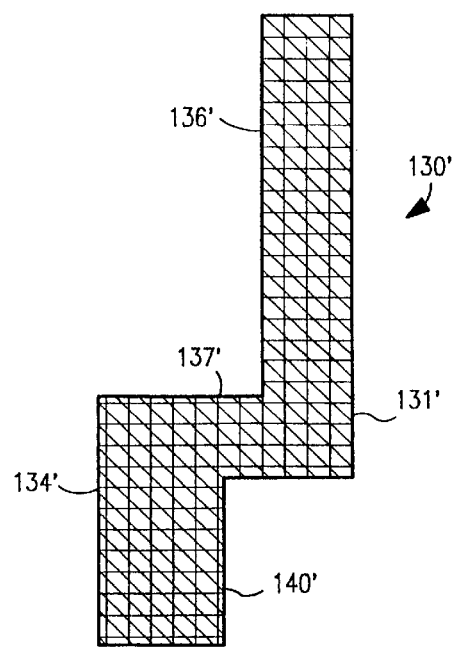
FIG. 9 is a side elevational view of the finite element model of the standard test bar and shim.

The shim modulus calculation process is described in more detail with reference to the schematic diagram shown in FIG. 8. In this process, a finite element model is generated using conventional FEA software with a shim 140' interposed between the calibrated finite element test bar 130' and ground(See FIG. 9). The shim includes standard dimensions that are largely arbitrary. In the most preferred embodiment, however, the shim is a tubular segment having an external diameter of 20 mm, a length of 25.4 mm, and a bore diameter of 8 mm. By adjusting the modulus of elasticity of the shim 140', its rigidity and consequently the natural frequencies of the finite element test bar 130' are varied. The shim modulus is determined by computing 52 the natural frequencies of the finite element test bar 130' and comparing the computed FEA frequencies with the measured frequencies for that mounting location. If the frequencies do not match, the modulus of elasticity of the shim is adjusted 54 and the natural frequencies are recomputed. The process is repeated until the FEA computed frequencies match the measured frequencies for that mounting location. For components having multiple mounting locations, the shim modulus is separately determined for each location. Alternatively, a chart can be generated for each standard test bar showing the appropriate shim modulus for any measured natural frequencies. Such a chart will eliminate the need to return to the finite element model of the test bar 130' to calculate the shim modulus for each mounting location.

Figure 10:
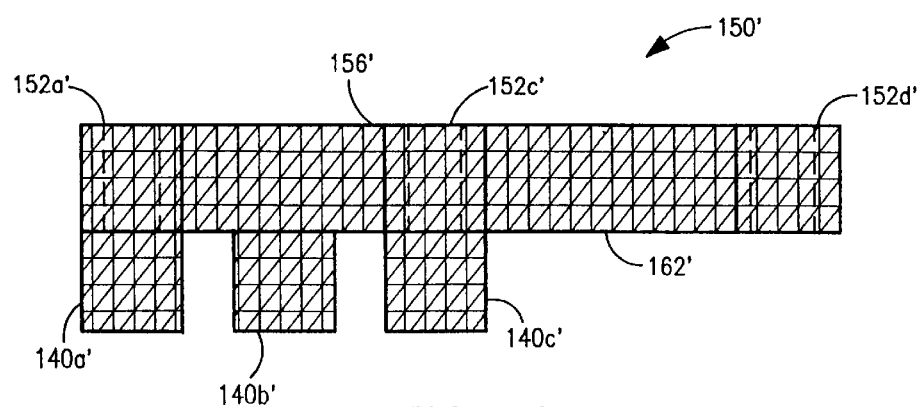
FIG. 10 is a side elevational view of the finite element model of the engine bracket and shims.

Once the appropriate shim modulus is determined, a finite element model of the component is generated using conventional FEA software. This finite element model includes a shim 140a–c' interposed between the component 150' and ground at each mounting location (See FIG. 10). Each of these shims 140a–c' is modeled with a modulus of elasticity that corresponds with the calculated shim modulus for that mounting location. Accordingly, the shims 140a–c' provide the finite element model with the approximate rigidity characteristics of the interface structure. As a result, this finite element model can be analyzed with conventional FEA techniques to provide an accurate computation of the component's natural frequencies.

While the present invention is described in connection with the modeling and design of an engine bracket, it is well suited for use in modeling and designing virtually any interfacing component. For example, the present method can be used to model and design a component that mounts to more than one interface structure or has multiple mounting locations on various planes. Further, the present invention is not limited for use in solid mechanics. The present invention can be used in virtually any application where boundary conditions can be emulated through the use of one or more shims.

The above description is that of a preferred embodiment of the invention. Various alterations and changes can be made without departing from the spirit and broader aspects of the invention as defined in the appended claims, which are to be interpreted in accordance with the principles of patent law including the doctrine of equivalents.

The embodiments of the invention in which an exclusive property or privilege is claimed are defined as follows:

1. A method for generating a finite element model of a component that is to be attached to an interface structure, comprising the steps of:

measuring a characteristic of a standard test bar mounted to the interface structure at a location where the component will be attached to the interface structure;

generating in a computer a finite element model having a finite element shim interposed between a finite element test bar and a ground, wherein the finite element shim includes a modulus of elasticity and the finite element test bar is a finite element model of the standard test bar;

selecting the modulus of elasticity of the shim such that a calculated characteristic of the finite element test bar correlates with the measured characteristic of the standard test bar;

generating in a computer a finite element model having a finite element shim with the selected modulus of elasticity interposed between the finite element model of the component and a finite element ground at a location corresponding to where the component will be attached to the interface structure to simulate the interface structure, and performing in a computer a desired finite element analysis on the finite element model of the component.

2. A method for generating a finite element model, comprising the steps of:

measuring a characteristic of a standard test bar mounted to an interface structure;

generating in a computer a finite element model having a finite element shim interposed between a finite element test bar and a ground, wherein the finite element shim includes a modulus of elasticity;

selecting the modulus of elasticity of the shim such that a calculated characteristic of the finite element test bar correlates with the measured characteristic of the standard test bar;

generating in a computer a finite element model having a finite element shim with the selected modulus of elasticity interposed between a component and a ground; and performing in a computer a desired finite element analysis on the finite element component, said measuring step further defined as measuring a natural frequency of the standard test bar; and said selecting step further defined as selecting the modulus of elasticity of the shim such that a calculated natural frequency of the finite element test bar correlates with the measured natural frequency of the standard test bar.

3. The method of claim 2 further comprising the step of calibrating the finite element test bar to correlate with the standard test bar.

4. The method of claim 3 wherein said calibrating step includes the steps of:

measuring a natural frequency of the standard test bar mounted to a bed plate;

generating a finite element model of a finite element test bar fixed to ground; and selecting the characteristics of the finite element test bar so that a calculated natural frequency of the finite element test bar correlates with the measured natural frequency of the standard test bar.

5. The method of claim 4 wherein said selecting step of said calibrating step includes selecting at least one of a modulus of elasticity and a density of the finite element test bar.

6. A method for generating a finite element model of a component adapted to interface with an interface structure, comprising the steps of:

generating in a computer a finite element component;

generating in a computer a finite element shim having a modulus of elasticity;

interposing the finite element shim between the finite element component and a ground;

selecting the modulus of elasticity of the finite element shim to provide the finite element component with a natural frequency corresponding to a natural frequency of the component when interfaced with the structure; and performing in a computer a desired finite element analysis on the finite element component.

7. The method claim 6 wherein said selecting step include the following steps:

providing a standard test bar;

mounting the standard test bar to the interface structure;

determining a natural frequency of the standard test bar attached to the interface structure; and selecting the modulus of elasticity of the finite element shim as a function of the determined natural frequency of the standard test bar attached to the interface structure.

8. The method of claim 7 further comprising the step of calibrating the standard test bar to correlate with a finite element test bar.

9. The method of claim 8 wherein said calibrating step includes the steps of:
   measuring a natural frequency of the standard test bar mounted to a bed plate;
   generating a finite element model of the finite element test bar fixed to ground; and
   selecting the characteristics of the finite element test bar so that a calculated natural frequency of the finite element test bar correlates with the measured natural frequency of the standard test bar.

10. The method of claim 9 wherein said selecting step of said calibrating step includes selecting at least one of a modulus of elasticity and a density of the finite element test bar.

11. A method for designing a component to interface with an interface structure, comprising the steps of:
   providing a standard test bar;
   mounting the standard test bar to the interface structure;
   measuring a natural frequency of the test bar mounted to the interface structure;
   generating, in a computer, a finite element model having a finite element representation of a shim interposed between a finite element representation of the component and a finite element ground;
   selecting the modulus of elasticity of the finite element representation of a shim as a function of the measured natural frequency of the test bar mounted to the interface structure; and
   performing, in a computer, finite element analysis of the finite element model.

12. The method of claim 11 wherein said selecting step includes the steps of:
   generating, in a computer, a finite element model having a finite element representation of a shim interposed between a finite element representation of the standard test bar and a finite element ground;
   computing, in the computer, a natural frequency of the finite element representation of the standard test bar;
   comparing the computed natural frequency with the measured natural frequency of the test bar mounted to the interface structure; and
   adjusting the modulus of elasticity of the shim and recomputing, in a computer, the natural frequency of the finite element representation of the standard test bar until the computed natural frequency corresponds with the measured natural frequency.

13. The method of claim 12 further comprising the steps of calibrating the standard test bar with the finite element representation of standard test bar.

14. The method of claim 13 wherein said calibrating step includes the steps of:
   mounting the standard test bar to a bed plate;
   measuring a natural frequency of the standard test bar mounted to a bed plate;
   generating, in a computer, a finite element model having a finite element representation of the standard test bar fixed directly to a finite element ground; and
   selecting the characteristics of the finite element representation of the standard test bar such that a computed natural frequency of the finite element representation of the standard test bar fixed directly to ground correlates with the measured natural frequency of the standard test bar mounted to the bed plate.

15. The method of claim 14 wherein said selecting step of said calibrating step includes selecting at least one of a modulus of elasticity and a density of the finite element representation of the standard test bar.

16. The method of claim 15 wherein said providing step includes selecting the geometry of the standard test bar such that a first natural of the standard test bar is easily discernible using conventional physical techniques when the standard test bar is attached to the bed plate.

17. The method of claim 16 wherein said selecting step of said providing step includes providing the standard test bar with a neck portion having an axis and a vertical portion extending parallel to the axis of the neck portion.

18. A method for generating a finite element model of a component to be attached to an interface structure in a computer, comprising the steps of:
   determining the rigidity of the interface structure at a location where the component is to be attached to, the interface structure;
   generating in a computer a finite element model having a finite element shim interposed between a finite element model of the component and a finite element ground at a location corresponding to where the component is to be attached to the interface structure, wherein the characteristics of the finite element shim are selected to simulate the rigidity of the interface structure and
   performing in a computer a desired finite element analysis on the finite element model of the component.

19. The method of claim 18 wherein said generating step includes selecting the modulus of elasticity of the finite element shim to correspond with the measured rigidity of the interface structure.

* * * * *